(12) United States Patent
Korol et al.

(10) Patent No.: US 11,722,103 B2
(45) Date of Patent: *Aug. 8, 2023

(54) REAL-TIME AND ADAPTIVE RADIO-FREQUENCY POWER PROTECTION

(71) Applicant: Renesas Electronics America Inc., Milpitas, CA (US)

(72) Inventors: Victor Korol, San Diego, CA (US); Roberto Aparicio Joo, San Diego, CA (US)

(73) Assignee: Renesas Electronics America Inc., Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/886,543

(22) Filed: Aug. 12, 2022

(65) Prior Publication Data
US 2022/0385243 A1    Dec. 1, 2022

Related U.S. Application Data

(60) Continuation of application No. 17/163,349, filed on Jan. 30, 2021, now Pat. No. 11,444,584, which is a
(Continued)

(51) Int. Cl.
*H03F 1/54* (2006.01)
*H03F 3/189* (2006.01)
*H03F 1/04* (2006.01)

(52) U.S. Cl.
CPC ............... *H03F 1/54* (2013.01); *H03F 1/04* (2013.01); *H03F 3/189* (2013.01); *H03F 2200/451* (2013.01)

(58) Field of Classification Search
CPC .......... H03F 1/52; H03F 1/0216; H03F 1/523; H03F 2200/447; H03F 2200/78;
(Continued)

(56) References Cited

U.S. PATENT DOCUMENTS

| 5,896,261 A * | 4/1999 | Black | H03G 3/3047 361/18 |
|---|---|---|---|
| 2015/0015339 A1* | 1/2015 | Gorbachov | H03G 3/3042 330/291 |

(Continued)

*Primary Examiner* — Ajibola A Akinyemi
(74) *Attorney, Agent, or Firm* — Scully, Scott, Murphy & Presser, P.C.

(57) ABSTRACT

An apparatus includes an amplifier circuit and a protection circuit. The amplifier circuit may be configured to generate an output signal by amplifying an input signal received at an input port. The input signal may be a radio-frequency signal. The protection circuit may be configured to (i) generate a detection signal by detecting when a level of the input signal exceeds a corresponding threshold, where the level is a power level, a voltage level or both, (ii) route the input signal away from the input port of the amplifier circuit and disable the amplifier circuit both in response to the detection signal being continuously active at least a first time duration and (iii) route the input signal to the input port of the amplifier circuit and enable the amplifier circuit both in response to the detection signal being continuously inactive at least a second time duration.

4 Claims, 10 Drawing Sheets

Related U.S. Application Data division of application No. 16/226,844, filed on Dec. 20, 2018, now Pat. No. 10,938,355.

(60) Provisional application No. 62/672,716, filed on May 17, 2018.

(58) Field of Classification Search
CPC .......... H03F 3/183; H03F 1/0266; H03F 1/04; H03F 1/54; H03F 2200/294; H03F 2200/451; H03F 2203/45692; H03F 3/189; H03F 3/217; H03F 3/2171; H03F 3/2173; H03F 3/24; H03F 3/3022; H03F 3/3076; H03F 3/45183; H03F 3/45475
USPC ....................................................... 455/117
See application file for complete search history.

(56) References Cited

U.S. PATENT DOCUMENTS

| | | | |
|---|---|---|---|
| 2015/0036247 A1* | 2/2015 | Hsia | H04B 3/02 361/56 |
| 2020/0212862 A1* | 7/2020 | Hulsteijn | H04B 1/0458 |

* cited by examiner

REAL-TIME AND ADAPTIVE RADIO-FREQUENCY POWER PROTECTION

CROSS-REFERENCE TO RELATED APPLICATIONS

This application is a continuation of U.S. Patent Application No. U.S. Ser. No. 17/163,349, filed on Jan. 30, 2021, which is a divisional of U.S. Patent Application No. U.S. Ser. No. 16/226,844, filed on Dec. 20, 2018, which claims the benefit of U.S. Provisional Application No. 62/672,716, filed on May 17, 2018. Each of the mentioned applications is hereby incorporated by reference in its entirety.

FIELD OF THE INVENTION

The invention relates to transceiver circuits generally and, more particularly, to a method and/or apparatus for real-time and adaptive radio-frequency power protection.

BACKGROUND

Typical communication systems have front-end radio-frequency (RF) circuits that include receive chains and transmit chains. The receive chains are designed to receive and amplify low power RF signals. Neighboring transmitters and leakage within the communication systems sometimes allow relatively high-power signals into the receive chains of the front-end circuitry. Such high-power signals can exceed a maximum input signal rating and cause damage to the receive chains.

It would be desirable to implement real-time and adaptive radio-frequency power protection.

SUMMARY

The invention concerns an apparatus including an amplifier circuit and a protection circuit. The amplifier circuit may be configured to generate an output signal by amplifying an input signal received at an input port. The input signal may be a radio-frequency signal. The protection circuit may be configured to (i) generate a detection signal by detecting when a level of the input signal exceeds a corresponding threshold, where the level is a power level, a voltage level or both, (ii) route the input signal away from the input port of the amplifier circuit and disable the amplifier circuit both in response to the detection signal being continuously active at least a first time duration and (iii) route the input signal to the input port of the amplifier circuit and enable the amplifier circuit both in response to the detection signal being continuously inactive at least a second time duration.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing real-time and adaptive radio-frequency power protection that may (i) be used in any receive chain, (ii) provide increased ruggedness, (iii) be more robust than common transceivers, (iv) be integrated with a low noise amplifier, (v) be integrated with a power amplifier, (vi) be integrated with a driver, (vii) be integrated with a buffer and/or (viii) be implemented as one or more integrated circuits.

Embodiments of the invention may provide real-time and adaptive radio-frequency power protection for amplifier circuitry in the receive channel of transceivers and/or receivers. The real-time protection may be implemented by limiting a bias current used in an amplifier and/or routing high-power input radio-frequency signals away from the amplifier. The adaptive protection may be provided by comparing the power levels and/or voltage levels in the input radio-frequency signal to multiple corresponding thresholds (e.g., two power levels and/or two voltage levels). The bias current limiting may be activated when an initial current threshold is exceeded. The re-routing if the input radio-frequency signal may be activated when a higher power threshold and/or voltage threshold is exceeded. In various embodiments, just the power levels may be detected and compared to the power thresholds. In other embodiments, just the voltage levels may be detected and compared to the voltage thresholds.

The bias current limiting protection may be designed to detect when the input radio-frequency signal exceeds approximately −14 decibel-milliwatts (dBm) of power and triggers a limit of a bias current consumed by an amplifier. An envelope detector may be followed by an optional timing/filter circuit and a current limiting circuit. The timing/filter circuit generally serves as a digital filter to reject the detector glitches and set the current protection engagement/disengagement timing. The current limiting circuit may allow/restrict current consumed by the amplifier.

The routing protection may be designed to detect when the input radio-frequency signal exceeds approximately −9 dBm of power and triggers a transition from the circuitry form a receive mode into a transmit mode. An envelope detector may be followed by a timing/filter circuit. The timing/filter circuit generally serves as a digital filter to reject the detector glitches and set the power protection engagement/disengagement timing.

Figure 1:
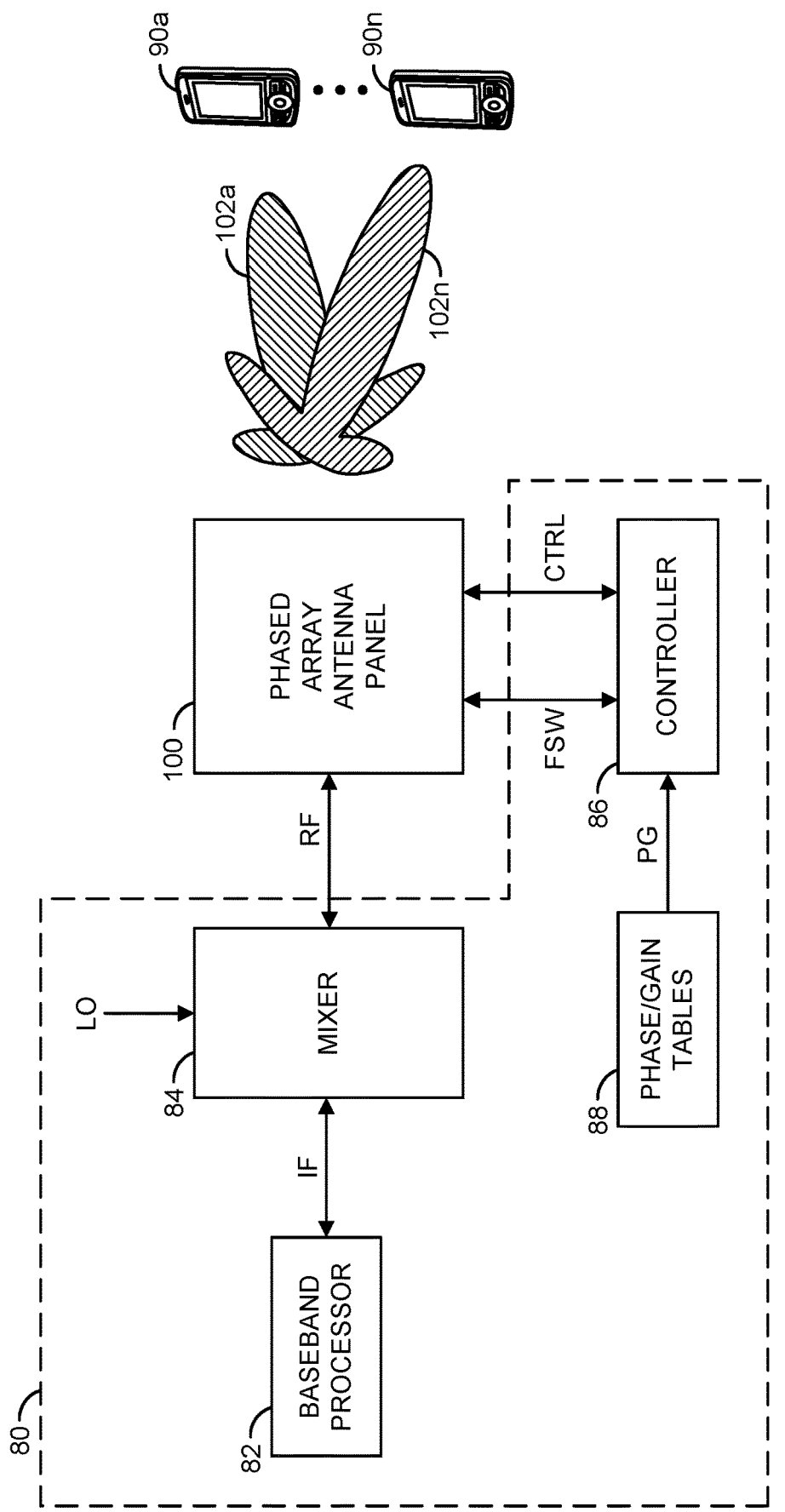
FIG. 1 is a diagram of a system illustrating a context of the invention.

Referring to FIG. 1, a block diagram of a system 80 is shown illustrating an example context of the invention. The system (or module or circuit or apparatus) 80 may implement a radio-frequency (RF) transceiver system in accordance with an example embodiment of the invention. The RF transceiver system 80 may be configured to operate at common wireless radio frequencies, millimeter-wave frequencies, and/or microwave frequencies. In an example, the RF transceiver system 80 may be configured to facilitate communication with and/or between a plurality of communications devices (or terminals) 90a-90n. In an example, the communications devices 90a-90n may include, but are not limited to, cellular telephones, mobile devices, tablets, internet-of-things (IoT) equipment, etc. In various embodiments, the RF transceiver system 80 and the communications devices 90a-90n may be coupled using at least one phased array antenna panel 100 in accordance with an example embodiment of the invention.

In an example, the RF transceiver system 80 may form part of a communications link. In some embodiments, the communications link may be part of a fifth generation (5G) wireless communications system (e.g., for which a standard is currently under development by the Next Generation Mobile Networks (NGMN) Alliance). In other embodiments, the communications link may be part of systems including, but not limited to, a fourth generation (4G) wireless communications system (e.g., International Mobile Telecommunications-Advanced (IMT-A) standard published by the International Telecommunications Unit Radiocommunication Sector (ITU-R)), a satellite communication (SATCOM) system, and point-to-point communications systems such as a common data link (CDL). However, other communications standards may be implemented to meet the design criteria of a particular application.

In an example, the RF transceiver system 80 may comprise a block (or circuit) 82, a block (or circuit) 84, a block (or circuit) 86, and a block (or circuit) 88. In various embodiments, the blocks 82-88 may be implemented with hardware, a combination of hardware and software, and/or simulated with software.

A signal (e.g., IF) may be exchanged between the circuit 82 and the circuit 84. The signal IF may implement an intermediate-frequency signal. In an example, the signal IF may be configured (e.g., using various modulation schemes) to carry information to be transmitted from and/or received by the RF transceiver system 80. In an example, a signal (e.g., LO) may be presented to the circuit 84. The signal LO may implement a local oscillator signal. A signal (e.g., RF) may be exchanged between the circuit 84 and the phased array antenna panel 100. The signal RF may be a radio-frequency, millimeter-wave frequency, or microwave frequency signal that conveys the information also found in the intermediate-frequency signal IF.

In a transmit mode, the radio-frequency signal RF may convey information to be broadcast from the phased array antenna panel 100 to the devices 90a-90n. In a receive mode, the radio-frequency signal RF may convey information received from the devices 90a-90n via the phased array antenna panel 100. A signal (e.g., FSW) and a signal or signals (e.g., CTRL) may be exchanged between the circuit 86 and the phased array antenna panel 100. The signal FSW may switch the phased array antenna panel 100 between the transmit mode and the receive mode. The signal(s) CTRL may convey data, clocking, and control elements. In an example, the signals FSW and CTRL may be part of a digital interface of the phased array antenna panel 100. In an example, the signal(s) CTRL may be implemented as a serial link that conveys information for configuring and/or determining phase and/or gain settings for antenna elements of the phased array antenna panel 100. In an example, the signal(s) CTRL may be compliant with one or more serial communication protocols or interfaces (e.g., serial peripheral interface (SPI), inter-integrated circuit communications (I2C), daisy chain, etc.). A signal or signals (e.g., PG) may be transferred from the circuit 88 to the circuit 86. In an example, the signal(s) PG may convey phase information and gain information used by the circuit 86 to implement (control) beam steering using the phased array antenna panel 100. In an example, the signal(s) PG may convey a plurality of phase and gain valves that may be programmed into a plurality of beam former circuits of the phased array antenna panel 100 via the signal(s) CTRL.

The phased array antenna panel 100 generally implements a hard-wired address scheme. The hard-wired address scheme may be used to uniquely identify serial communications intended for elements (e.g., the beam former circuits) of the phased array antenna panel 100. In various embodiments, multiple phased array antenna panels 100 may be combined to form a larger antenna array that may provide more transmission channels. The multiple phased array antenna panels may share a serial communication channel, link, or bus. Each of the phased array antenna panels 100 making up the larger antenna array may be uniquely addressed using respective hard-wired addresses.

The phased array antenna panel 100 may generate one or more fields (or beams) 102a-102n. The fields 102a-102n may represent a field pattern (or radio-frequency beam pattern) created by the beam former circuits of the phased array antenna panel 100 based upon the phase and gain information (values) received via the signal(s) CTRL. The phased array antenna panel 100 may be configured to produce directional beams 102a-102n for communication with the communication devices 90a-90n. In an example, the phased array antenna panel 100 may be controlled to steer the beams 102a-102n, based on the phase and gain information received via the signal(s) CTRL, to track movement of the communication devices 90a-90n and/or switch between the communication devices 90a-90n.

The circuit 82 may implement a baseband processor circuit. The circuit 82 may be operational to process the information sent by and/or received in the intermediate-frequency signal IF. The circuit 82 may process the information within the RF transceiver system 80. The processing may include, but is not limited to, modulation/demodulation of the signal that contains the information and management of simultaneous communications between the RF transceiver system 80 and the multiple remote terminals 90a-90n.

The circuit 84 may implement one or more mixer circuits. The circuit 84 is generally operational to frequency convert (e.g., up-convert, down-convert, etc.) between an intermediate frequency used for the signal IF and the radio frequency, millimeter-wave frequency, or microwave frequency used for the signal RF. The frequency conversion may be based on one or more local oscillator frequencies provided by the signal LO. In various embodiments, the radio-frequency signal RF may be in a range of frequencies approximately centered around a center frequency of either 28 gigahertz (GHz) or 39 GHz (e.g., 24 GHz to 30 GHz or 37 GHz to 44 GHz). In embodiments implementing multiple intermediate frequencies, each intermediate frequency may cover a band from approximately 2 GHz to about 6 GHz (e.g., an approximately 4-GHz bandwidth). In an example, each local oscillator frequency may range from approximately 22 GHz to 26 GHz when the signal RF is approximately centered at 28 GHz. In another example, each local oscillator frequency may range from approximately 33 GHz to 37 GHz when the signal RF is approximately centered at 39 GHz. However, other frequency ranges may be implemented to meet the design criteria of a particular application.

The circuit 86 may implement a control circuit. In various embodiments, the circuit 86 may be implemented using one or more of an application specific integrated circuit (ASIC), controller, microprocessor, or circuitry configured accordingly. The circuit 86 is generally operational to control the operations of the phased array antenna panel 100. In some embodiments, the circuit 86 may determine the setting values used in each transceiver channel within the beam former circuits of the phased array antenna panel 100. The setting values may establish the geometry of the field(s) or beam(s) 102a-102n. In various embodiments, the circuit 86 may be implemented as one or more integrated circuits.

In an example, the circuit 88 may implement a table of values (e.g., embodied in a memory circuit). In an example, the table of values embodied in the circuit 88 may be configured to store multiple gain (G) values and multiple phase (P) values. The phase and gain values may be used by the transceiver channels in the phased array antenna panel 100 to establish the fields 102a-102b. The phase values and the gain values may be fetched from the circuit 88 via the signal PG and programmed into buffers associated with the beam former circuits of the phased array antenna panel 100 by the circuit 86. In various embodiments, the circuits 86 and 88 may be implemented either on the same integrated circuit or on different (separate) integrated circuits.

In an example, the phased array antenna panel 100 may be implemented comprising either single-polarization (or single-pole) antenna elements or dual-polarization (or dual-pole or di-pole) antenna elements. The phased array antenna panel 100 may be operational to transmit and receive wireless signals to and from the devices (or terminals) 90a-90n. The devices (or terminals) 90a-90n may be remotely located from the RF transceiver system 80. Sensitivity to the wireless signals may be determined by the fields 102a-102n created by the phased array antenna panel 100. The phased array antenna panel 100 may comprise a plurality of antenna elements and a plurality of beam former circuits. Each beam former circuit may implement a plurality of transceiver channels. Each transceiver channel generally comprises a transmit channel and a receive channel. The transceiver channels may be coupled to the antenna elements by corresponding bidirectional radio-frequency signals. The transceiver channels and antenna elements generally form a two-dimensional antenna network.

Figure 2:
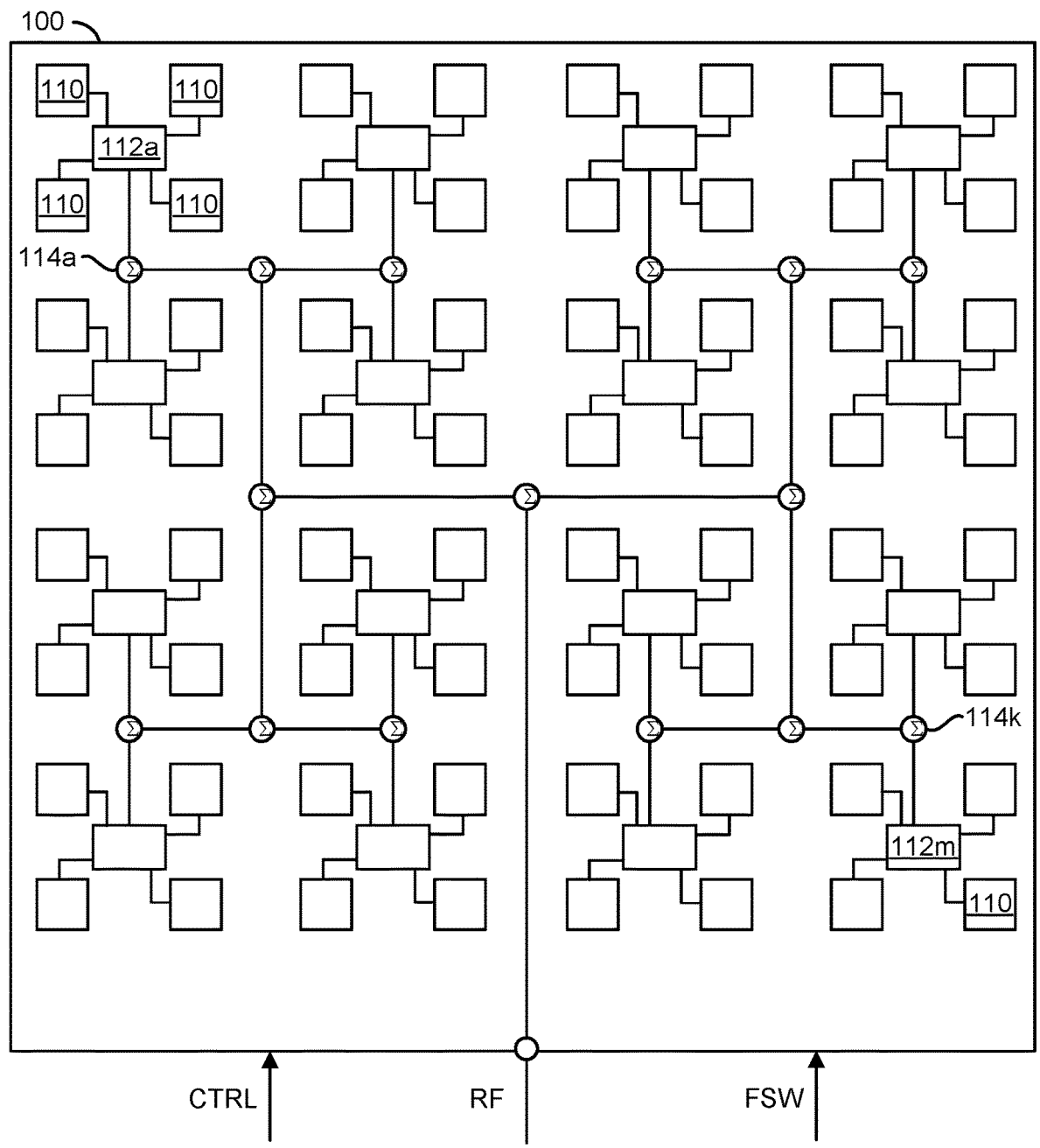
FIG. 2 is a diagram illustrating a single-polarization phased array antenna panel in accordance with an example embodiment of the invention.

Referring to FIG. 2, a diagram is shown illustrating an example implementation of a single-polarization version of the phased array antenna panel 100 in accordance with an example embodiment of the invention. In an example, the phased array antenna panel 100 may comprise a number of blocks (or circuits) 110, a number of blocks (or circuits) 112a-112m, and a number of blocks (or circuits) 114a-114k. In embodiments implementing a single-polarization phased array antenna panel, the blocks 110 generally are implemented as single polarization (or single-pole) antenna elements. Each of the circuits 112a-112m may implement a single-polarization beam former circuit (or device). Each of the circuits 114a-114k may implement a combiner/splitter circuit. The circuits 112a-112m, and 114a-114k may be implemented with hardware, a combination of hardware and software, and/or simulated with software. In an example, the signal RF may be exchanged with one of the circuits 114a-114k. The signals FSW and CTRL may be exchanged with the circuits 112a-112m.

The antenna elements 110 in the phased array antenna panel 100 may be used for both transmission and reception. A physical positioning of the antenna elements 110 generally provides for two-dimensional (e.g., horizontal and vertical) control of the fields 102a-102n. In an example, the antenna elements 110 may be arranged in a 2-dimensional (e.g., N×N) grid pattern, where N is an integer value divisible by 2. However, other dimensions of grid patterns may be implemented accordingly to meet design criteria of a particular implementation.

The circuits 112a-112m are generally operational to multiplex/demultiplex the signal RF with a number of the antenna elements 110. In various embodiments, each of the circuits 112a-112m may be mounted on a substrate of the phased array antenna panel 100 adjacent to (e.g., centered among) a number (or group) of the antenna elements 110. In an example, each circuit 112a-112m generally comprises a number of transceiver channels that are coupled to respective antenna elements 110. In an example, each circuit 112a-112m may be coupled to four adjacent antenna elements 110 (e.g., arranged in a 2×2 grid around each circuit 112a-112m). However, other numbers (e.g., 1, 2, 4, 18, etc.) of adjacent antenna elements 110 may be implemented to meet design criteria of a particular implementation. The circuits 112a-112m may be configured to switch between a transmit mode and a receive mode in response to the signal FSW. In the transmit mode, the circuits 112a-112m may be operational to rapidly change setting values (e.g., phase values, gain values, etc.) used by the transceiver channels in order to steer the beams (or fields) 102a-102n formed by the phased array antenna panel 100. In various embodiments, each of the circuits 112a-112m may be implemented as one or more integrated circuits (e.g., in a package or multi-chip module (MCM)).

In various embodiments, each of the circuits 114a-114k may be implemented as a combiner/splitter circuit. In an example, the circuits 114a-114k may be implemented as Wilkinson combiner/splitters. In various embodiments, the circuits 114a-114k may be coupled together to form a network that couples the circuits 112a-112m to an input/output of the phased array antenna panel 100 configured to present/receive the signal RF. In the transmit mode, the circuits 114a-114k are generally operational to distribute the power in the signal RF among the circuits 112a-112m. In the receive mode, the circuits 114a-114k may be operational to combine the power received in signals from the circuits 112a-112m into the signal RF. The circuits 112a-112n and 114a-114k are generally configured to provide a substantially equivalent path length between the RF input/output of the phased array antenna panel 100 and each of the circuits 112a-112m.

Figure 3:
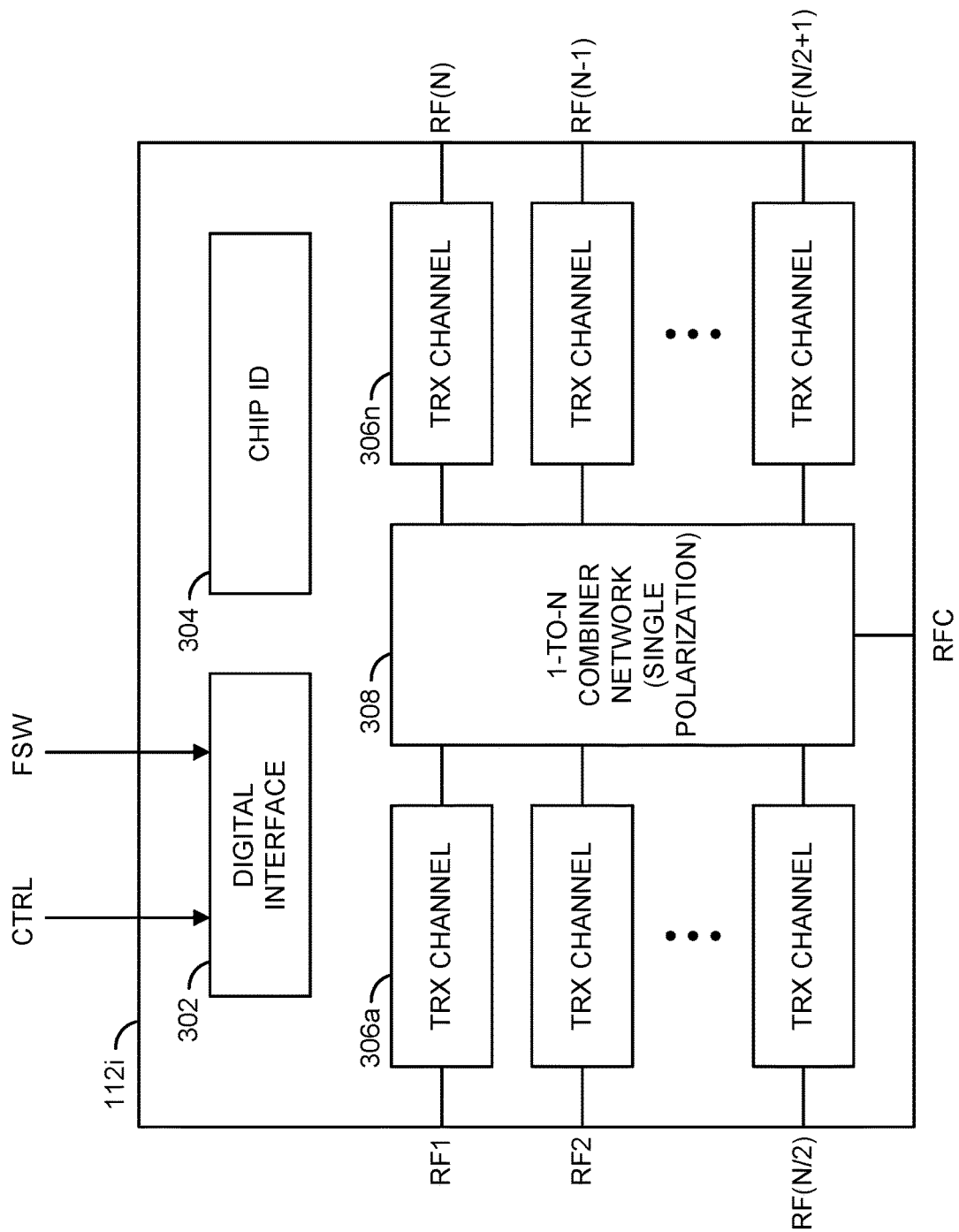
FIG. 3 is a diagram illustrating a single-polarization beam former circuit in accordance with an example embodiment of the invention.

Referring to FIG. 3, a diagram is shown illustrating an example implementation of a single-polarization beam former circuit 112i in accordance with an example embodiment of the invention. In an example, the single-polarization beam former circuit 112i may be representative of the single-polarization beam former circuits 112a-112m of FIG. 2. In an example, the single-polarization beam former circuit 112i may have a digital interface configured to receive the signal FSW and the signal(s) CTRL, a common RF input/output port (RFC), and a number of antenna input/output ports (RF1-RFN). In general, any number (e.g., N) of antenna input/output ports (or channels) may be implemented accordingly to meet design criteria of a particular implementation.

In various embodiments, the signal RF may be presented/received by the common RF input/output RFC, and the antenna input/output ports RF1-RFN may be coupled to respective antenna elements 110. The single-polarization beam former circuit 112i generally implements a number of transceiver channels corresponding to the number of antenna input/output ports RF1-RFN. In various embodiments, each of the transceiver channels may comprise a respective transmit channel and a respective receive channel. The transceiver channels are generally configured to switch between transmitting and receiving based upon the signal FSW.

The single-polarization beam former circuit 112i generally implements a transmit mode and a receive mode. In an example, a state of the signal FSW may determine whether the transmit mode or the receive mode is active. In the transmit mode, the single-polarization beam former circuit 112i is generally configured to receive the radio-frequency signal RF at the common input/output port RFC and present radio-frequency signals at the antenna input/output ports RF1-RFN. The signals presented at each of the antenna input/output ports RF1-RFN are generated by the single-polarization beam former circuit 112i in response to the radio-frequency signal RF received at the common input/output port RFC and a respective number of setting values (e.g., gain, phase, etc.) for each transceiver channel corresponding to each of the antenna input/output ports RF1-RFN. In the receive mode, the single-polarization beam former circuit 112i is generally configured to combine radio-frequency signals received at the antenna input/output ports RF1-RFN for presentation as the signal RF at the common input/output port RFC.

The single-polarization beam former circuit 112i may comprise a block (or circuit) 302, a block (or circuit) 304, a number of blocks (or circuits) 306a-306n, and a block (or circuit) 308. The circuit 302 may implement an interface circuit. In various embodiments, the circuit 302 may implement a digital interface. The circuit 304 may implement a hard-wired address (e.g., chip ID) for the beam former circuit 112i. The circuits 306a-306n may implement transceiver (TRX) channels. The circuit 308 may implement a 1-to-N combiner/splitter network.

In an example, the signals FSW and CTRL are exchanged with the circuit 302. In an example, the circuit 302 may comprise a serial interface. The circuit 302 may be configured to be compliant with one or more serial interface standards including, but not limited to, serial peripheral interface (SPI), inter-integrated circuit (I2C), daisy chain, etc. In an example, the circuit 302 may be configured to allow programming and control of the single-polarization beam former circuit 112i using a serial communication link (or bus). In an example, the circuit 302 may be configured to program and control the circuits 306a-306n in response to the signals CTRL and FSW. In an example, the circuit 302 may control whether the circuits 306a-306n operate in a transmit mode or a receive mode in response to the signal FSW. In an example, the circuit 302 may implement a 4-wire embedded SPI core. In an example, the circuit 304 may set a physical address of the beam former circuit 112i based upon hardware coded address bits (or pins). In some embodiments, the hard-wired address bits may be hard coded within the chip implementing the beam former 112i. In some embodiments, the hard-wired address bits may be programmable within the chip implementing the beam former 112i during manufacturing. In an example, the hard-wired address bits may be programmed using fuses, anti-fuses, or other conventional techniques.

Figure 4:
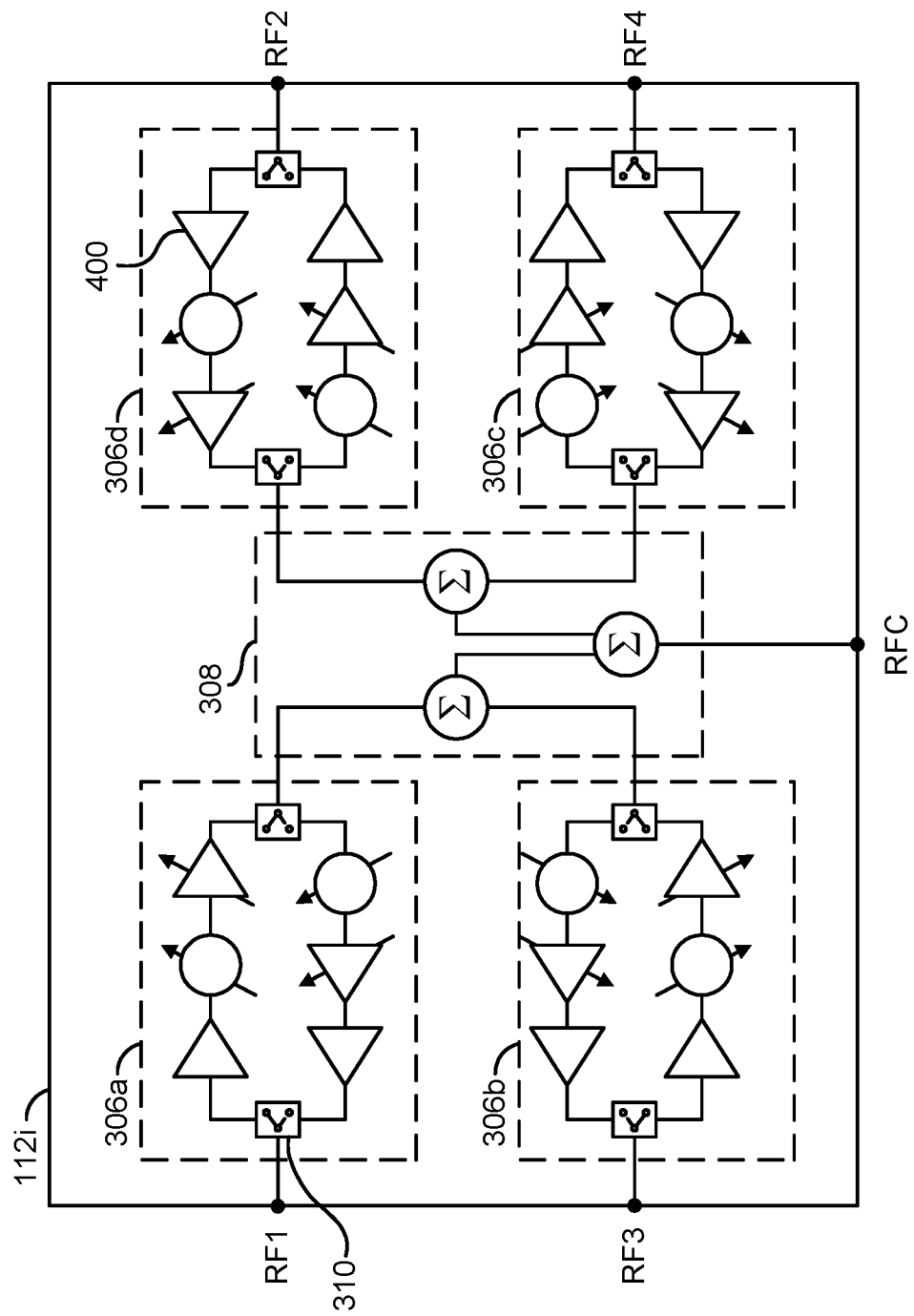
FIG. 4 is a diagram illustrating a four transceiver channel single-polarization beam former circuit in accordance with an example embodiment of the invention.

Referring to FIG. 4, a diagram is shown illustrating an example implementation of a generic 2×2 four-element single-polarization transceiver beam former circuit 112i in accordance with an example embodiment of the invention. In various embodiments, beam former circuits may implement a plurality of transceiver channels. Each transceiver channel generally comprises a transmit channel and a receive channel. In an example, the 2×2 four-element single-polarization transceiver beam former circuit 112i may implement four transceiver channels 306a-306d. Each of the four transceiver channels (or circuits) 306a-306d may include a transmit/receive (T/R) switch 310 that may couple to respective antenna elements in a group of adjacent antenna elements by corresponding bidirectional radio-frequency signals (e.g., RF1-RF4). Each of the four transceiver channels 306a-306d may include an amplifier (or circuit) 400. The transceiver channels and antenna elements generally form a two-dimensional antenna network.

In an example, the circuit 308 may be implemented as a 1-4 combiner/splitter network. In an example, the circuit 308 may comprise a number of combiner/splitters. In an example, the combiner/splitters may be implemented as Wilkinson combiner/splitters. In various embodiments, the combiner/splitters may be coupled together to form a network that couples the circuits 306a-306d to a common RF input/output port RFC of the beam former circuit 112i. In the transmit mode, the circuit 308 is generally operational to distribute the power in a signal at the common RF input/output port RFC among the circuits 306a-306d. In the receive mode, the circuit 308 may be operational to combine the power received in signals from the circuits 306a-306d into a signal presented at the common RF input/output port RFC. The circuits 306a-306d and 308 are generally configured to provide a substantially equivalent path length between the common RF input/output port RFC and each of the circuits 306a-306d. The topology of the beam former circuit 112i may be scaled to provide other numbers of transceiver channels to meet the design criteria of a particular implementation.

Each switch 310 may be implemented as a distributed transceiver switching circuit (or device). A portion of each switch 310 may be implemented in (on) the integrated circuits (or chips) used to form the circuits 306a-306d. Another portion of each switch 310 may be implemented in transmission lines in (on) packages that house the integrated circuits. Still another portion of each switch 310 may be implemented in solder bumps used to connect the integrated circuits to the transmission lines in the packages.

The amplifiers 400 may be configured to amplify data received at an input port in the input signals RF1-RF4, respectively. Each amplifier 400 may include a low noise amplifier having an input port and one or more protection circuits. A protection circuit may be configured to detect when a power level and/or a voltage level of the input signal RF1-RF4 exceeds one or both corresponding power threshold/voltage threshold, and route the input signal RF1-RF4 away from the input port and disable the low noise amplifier both in response to at least one of the power/voltage levels being continuously monitored above the power/voltage thresholds at least a time duration. The protection circuit may also be configured to route the input signal to the input port of the low noise amplifier circuit and enable the low noise amplifier circuit both in response to both the power/ voltage levels being continuously monitored below the power/voltage thresholds at least another time duration.

Another protection circuit may be configured to detect when power/voltage levels of the input signal RF1-RF4 exceed initial power/voltage thresholds, and adjust a bias current to the low noise amplifier both in response to the power/voltage levels being continuously monitored above the initial power/voltage thresholds at least another time duration. The other protection circuit may also be configured to restore the full bias current to the low noise amplifier circuit in response to the power/voltage levels being continuously monitored below the initial power/voltage thresholds at least yet another time duration.

Figure 5:
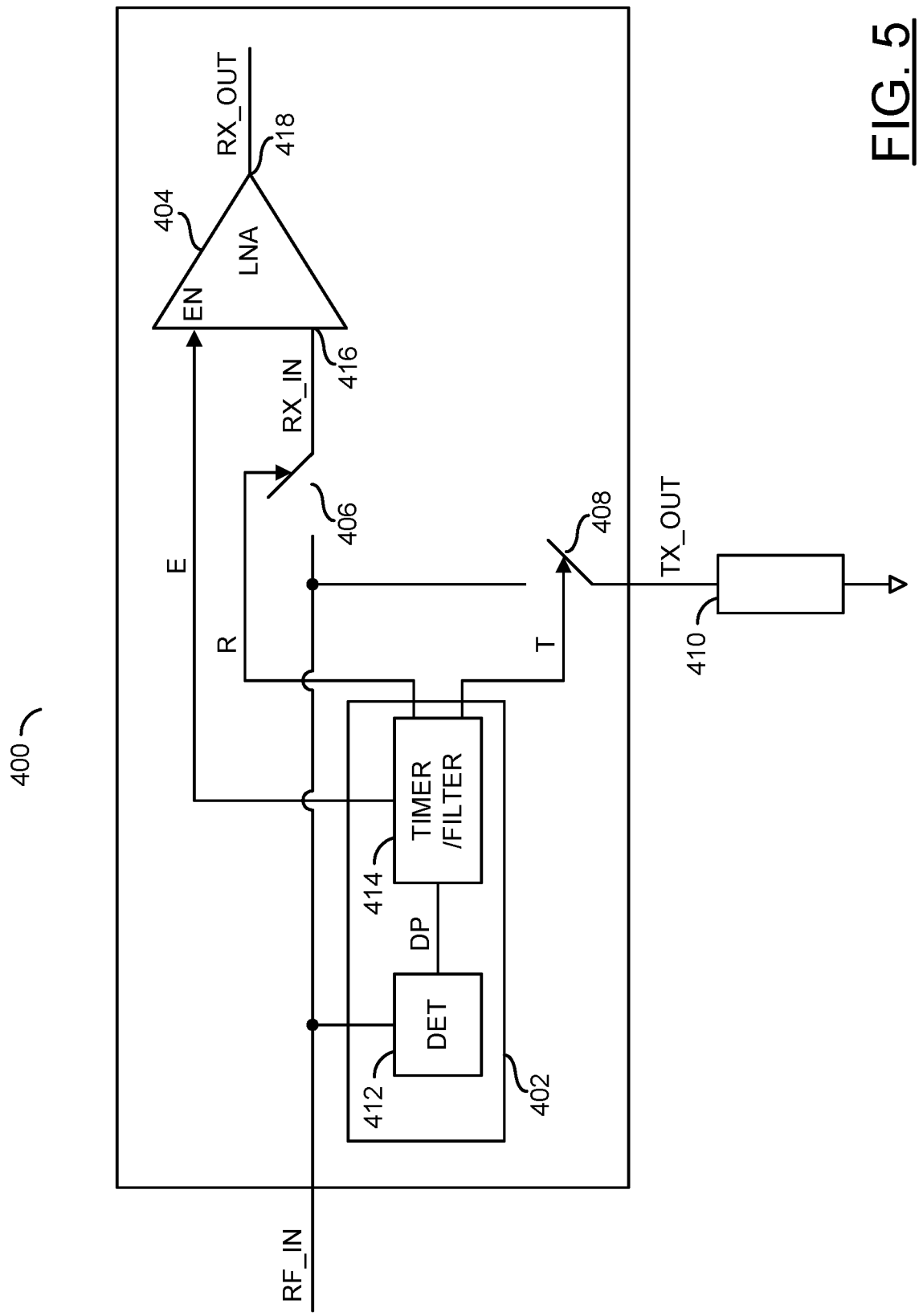
FIG. 5 is a diagram illustrating an apparatus with routing protection in accordance with an example embodiment of the invention.

Referring to FIG. 5, a diagram illustrating an example implementation of an apparatus 400 with the routing protection is shown in accordance with an example embodiment of the invention. The apparatus (or system) 400 may implement a transceiver switch with real-time and adaptive radio-frequency (RF) power protection. The apparatus 400 generally comprises a block (or circuit) 402, a block (or circuit) 404, a block (or circuit) 406, a block (or circuit) 408 and a block (or circuit) 410. The circuit 402 may comprise a block (or circuit) 412 and a block (or circuit) 414. The circuit 404 may have an input port 416 and an output port 418. The circuits 402-414 may be implemented with hardware and/or simulated with software. In various embodiments, the circuits 402-414 may be implemented as one or more integrated circuits.

A signal (e.g., RF_IN) may be received by the circuits 402, 412, 402 and 408. The signal RF_IN may implement an input radio-frequency signal. A signal (e.g., DP) may be generated by the circuit 412 and transferred to the circuit 414. The signal DP may be a detection signal for a power level and/or a voltage level in the signal RF_IN. The circuit 414 may generate a signal (e.g., E) received by the circuit 404. The signal E may control an enable/disable condition of the circuit 404. A signal (e.g., R) may be generated by the circuit 414 and transferred to the circuit 406. The signal R may control an open/closed condition of the circuit 406. A signal (e.g., T) may be generated by the circuit 414 and transferred to the circuit 408. The signal T may control an open/closed condition of the circuit 408. A signal (e.g., RX_IN) may be transferred from the circuit 406 to the circuit 404. The signal RX_IN may implement a receive signal. The circuit 404 may generate a signal (e.g., RX_OUT). The signal RX_OUT may be an amplified version of the signal RX_IN. A signal (e.g., TX_OUT) may be transferred from the circuit 408 to the circuit 410. The signal TX_OUT may implement a transmit output signal.

The circuit 402 may implement a protection circuit. The protection circuit 402 is generally operational to generate the signals E, R and T in response to power levels and/or voltage levels detected in the input signal RF_IN. The protection circuit 402 may generate the signal DP in an active (or logical high) state while the power/voltage levels of an envelope of the input signal RF_IN exceed at least one of the power/voltage thresholds. Otherwise, the signal DP may be generated in an inactive (or logical low) state. While the signal DP is continuously in the active state for at least a power/voltage engagement time period, the protection circuit 402 may (i) generate the receive switch signal R in the open state and the transmit switch signal T in the closed state to route the input signal RF_IN away from the input port 416 of circuit 404 and (ii) generate the enable signal E in the disabled state to limit a bias current consumed by the circuit 404. The limited bias current flowing into the circuit 404 may protect the circuit 404 from being damaged by excessive power/voltage in the signal RX_IN. While the signal DP is continuously in the inactive state for at least a disengagement time period, the protection circuit 402 may (i) generate the receive switch signal R in the closed state and the transmit switch signal T in the open state to route the input signal RF_IN to the input port 416 of the circuit 404 and (ii) generate the enable signal E in an enabled state to enable the circuit 404 to consume an unrestricted bias current. The unrestricted bias current may enable the circuit 404 to perform a normal amplifying function for the signal RX_IN. In various embodiments, the input signal RF_IN may be a radio-frequency signal in a range from a megahertz (MHz) to a terahertz (THz). In some embodiments, the input signal RF_IN may be in a range of frequencies from approximately 2 gigahertz (GHz) to approximately 5 GHz. In other embodiments, the input signal RF_IN may be in a range of frequencies centered around approximately 28 GHz or approximately 39 GHz (e.g., 24 GHz to 30 GHz or 37 GHz to 44 GHz). In still other embodiments, the input signal RF_IN may be in a range of frequencies from approximately 2 GHz to 44 GHz. Other frequency ranges may be implemented to meet the design criteria of a particular application.

The circuit 404 may implement an amplifier circuit. In some embodiments, the amplifier circuit 404 may be a low noise amplifier (LNA) circuit (for example, as implemented in the beam former circuit 112i). In various embodiments, the amplifier circuit 404 may be a power amplifier circuit. In other embodiments, the amplifier circuit 404 may be a driver circuit or a buffer circuit. The amplifier circuit 404 is generally operational to generate the output signal RX_OUT by amplifying the signal RX_IN while in an enabled condition (e.g., the signal E is in the enabled state). The amplifier circuit 404 may be operational to operate in a disabled condition with a low bias current while the signal E in the disabled state. While in the disabled condition, the amplifier circuit 404 is generally more immune to power surges (e.g., more robust) in the signal RX_IN than while in the enabled condition.

The circuit 406 may implement a receive switch (RX SW) controlled by the receive switch signal R. The receive switch 406 is generally operational to pass the signal RF_IN to the signal RX_IN while in a closed condition (e.g., the signal R is in the closed state). The receive switch 406 may present a high impedance between the signal RF_IN and the signal RX_IN while in an open condition (e.g., the signal R is in the open state).

The circuit 408 may implement a transmit switch (TX SW) controlled by the transmit switch signal T. The transmit switch 408 is generally operational to pass the signal RF_IN to the signal TX_OUT while in a closed condition (e.g., the signal T is in the closed state). The transmit switch 408 may present a high impedance between the signal RF_IN and the signal TX_OUT while in an open condition (e.g., the signal T is in the open state).

The circuit 410 may implement a load impedance circuit. In various embodiments, the load circuit 410 may be a resistor (e.g., a 50 ohm resistor). In some embodiments, the load circuit 410 may be implemented as a portion of a transmit channel (or chain) of the apparatus 400 (e.g., a transmit driver circuit). Other types of load circuits 410 and/or other load impedances may be implemented to meet the design criteria of a particular application.

The circuit 412 may implement a detection circuit. The detection circuit 412 is generally operational to generate the signal DP by detecting the amount of power and/or voltage present in the signal RF_IN relative to the power/voltage thresholds. While at least one of the power level and/or the voltage level in the signal RF_IN is above the power/voltage thresholds, the detection circuit 412 may generate the signal DP in a high-power/voltage state (e.g., logical high). Otherwise, the detection circuit 412 may generate the signal DP in a low-power/voltage state (e.g., logical low). In various embodiments, the power threshold may be −7±2 dBm. Other power thresholds and/or voltage thresholds may be implemented to meet the design criteria of a particular application.

The circuit 414 may implement a timer/filter circuit. The timer/filter circuit 414 is generally operational to generate the signals E, R and T based on the signal DP relative to the engagement time period and the disengagement time period. If the signal DP is continuously in the high-power/voltage level for at least the engagement time period, the timer/filter circuit 414 may generate the signals R and T to route the signal RF_IN away from the amplifier circuit 404, and generate the signal E to place the amplifier 404 in the disabled condition. In various embodiments, the engagement time period may be programmable in a range of 2 microseconds to 4 microseconds. If the signal DP is continuously in the low-power/voltage level for at least the disengagement time period, the timer/filter circuit 414 may generate the signals R and T to route the signal RF_IN to the amplifier circuit 404, and generate the signal E to place the amplifier 404 in the enabled condition. The disengagement time period may be separately programmable in a range of 2 microseconds to 4 microseconds. The voltage levels and/or polarities of the signal E, R and T may each be set independently of each other.

Figure 6:
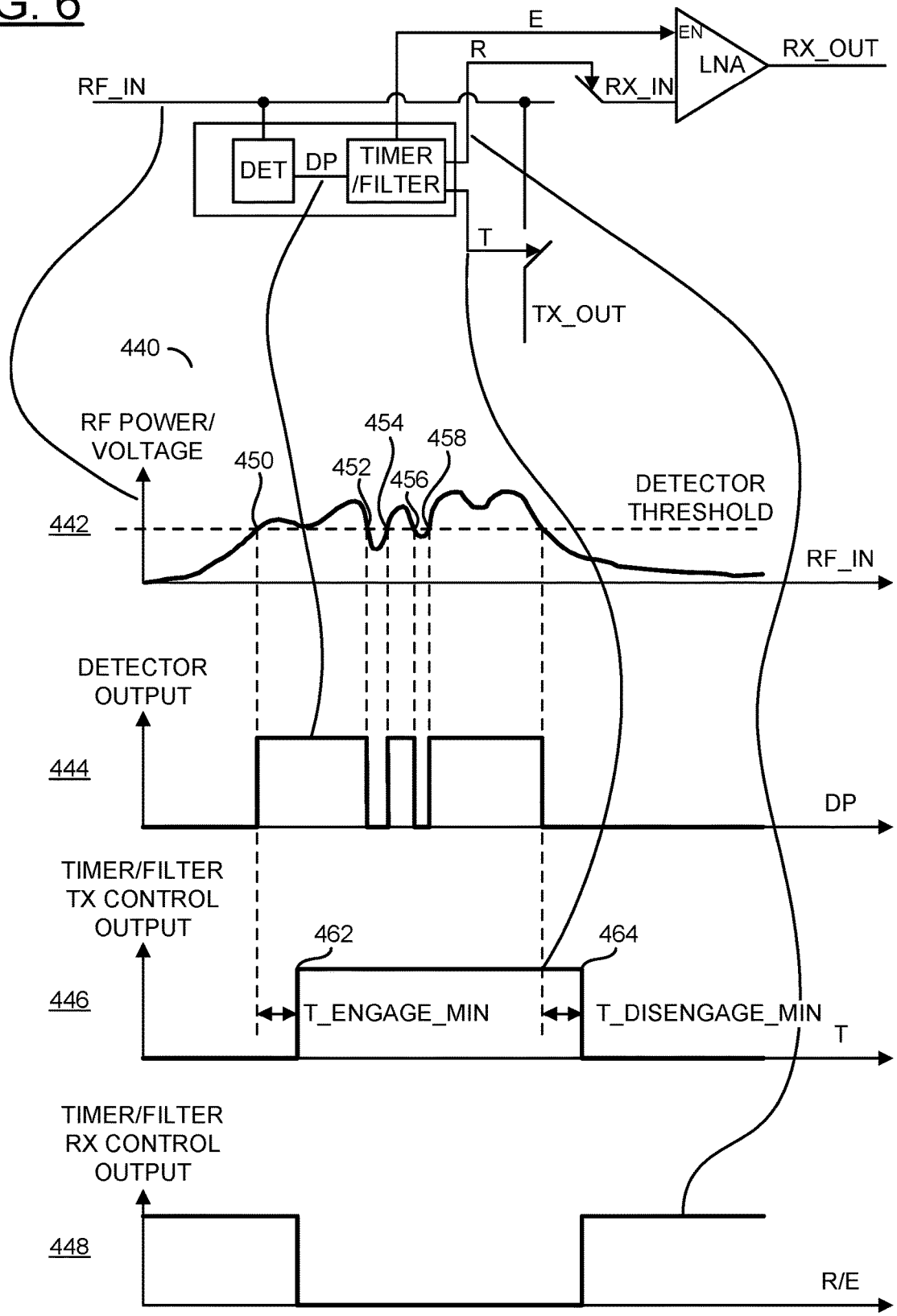
FIG. 6 is a diagram illustrating waveforms of the apparatus of FIG. 5 in accordance with an example embodiment of the invention.

Referring to FIG. 6, a diagram 440 illustrating example waveforms of the apparatus 400 is shown in accordance with an example embodiment of the invention. In the embodiment shown, the signals R and E may use the same voltage level and polarity and so may be generated together as the same signal. A waveform 442 may represent the input signal RF_IN. The signal DP may be represented by a waveform 444. A waveform 446 may represent the signal T. The signals R and E may be represented by a waveform 448.

At a time 450, the envelope power/voltage in the input signal RF_IN may exceed the detected power/voltage thresholds causing the detection circuit 412 to assert the signal DP in the high-power state. The power/voltage in the input signal RF_IN may drop back below the detected power/voltage thresholds at the time 452 resulting in the detection circuit 412 deasserting the signal DP in the low-power state. The power/voltage detected in the input signal RF_IN may exceed the power/voltage thresholds at times 454 and 458 with corresponding assertions of the signal DP in the high-power state. The power/voltage detected in the input signal RF_IN may drop below the power/voltage thresholds at times 456 and 460 resulting the deassertion of the signal DP to the low-power state.

While the signal DP is continuously asserted in the high-power state for greater than the minimum engagement time period (T_ENGAGE_MIN), the timer/filter circuit 414 may assert the signal T into the closed state, dessert the signal R into the open state, and deassert the signal E into the disabled state to route the high-powered signal RF_IN to the load circuit 410 and away from the amplifier circuit 404 thereby protecting the amplifier circuit 404. The timer/filter circuit 414 may filter the transitions between (i) the times 452 and 454 and (ii) the times 456 and 458 since both durations are shorter than the minimum disengagement time period. While the signal DP is continuously deassert in the low-power state for greater than the minimum disengagement time period (T DISENGAGE MIN), the timer/filter circuit 414 may deassert the signal T into the open state, assert the signal R into the closed state, and assert the signal E into the enabled state to route the low-power signal RF_IN to the amplifier circuit 404 for subsequent amplification.

Figure 7:
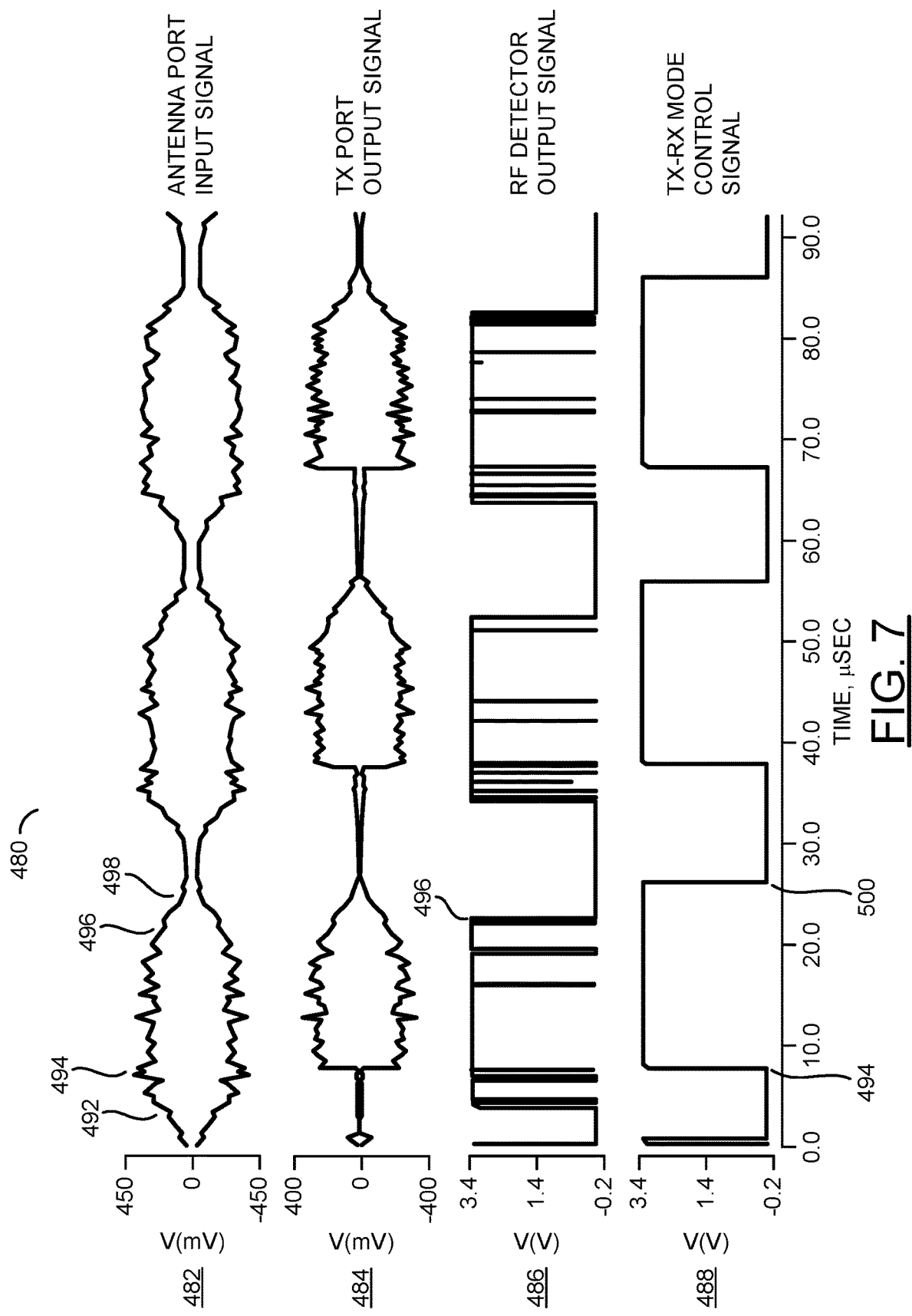
FIG. 7 is a diagram illustrating measured waveforms of the apparatus of FIG. 5 in accordance with an example embodiment of the invention.

Referring to FIG. 7, a diagram 380 illustrating measured waveforms of the apparatus 400 is shown in accordance with an example embodiment of the invention. A waveform 482 may represent the input signal RF_IN. The signal RF_IN may include additional power level fluctuations of −20 dBm to −4 dBm. The signal TX_OUT may be represented by a waveform 484. The signal DP may be represented by a waveform 486. A waveform 488 may represent the signals T and R (with the same voltage levels and polarity).

At a start of a frame in the input signal RF_IN, the envelope power/voltage level may transition 492 from a low-power/voltage level to a high-power/voltage level. At the time 494, the envelope power/voltage level may exceed the power/voltage thresholds for at least the minimum engagement time period. Prior to the time 494, the protection circuit 402 may route the input signal RF_IN to the amplifier circuit 404 and so the signal TX_OUT may be held low by the load circuit 410. At the time 494, the protection circuit 402 may route the input signal away from the amplifier circuit 404 and into the signal TX_OUT (e.g., the signals R and T may change states).

Beginning at the time 496, the frame in the input signal RF_IN may transition 498 back to the low-power/voltage level. At the time 500, the power/voltage level in the input signal RF_IN may be below the power/voltage thresholds for at least the minimum disengagement time period. In response to the low power in the signal RF_IN for greater than the disengagement time period, the protection circuit 402 may change routing of the input signal RF_IN back to the amplifier circuit (e.g., the signals R and T may change states).

Figure 8:
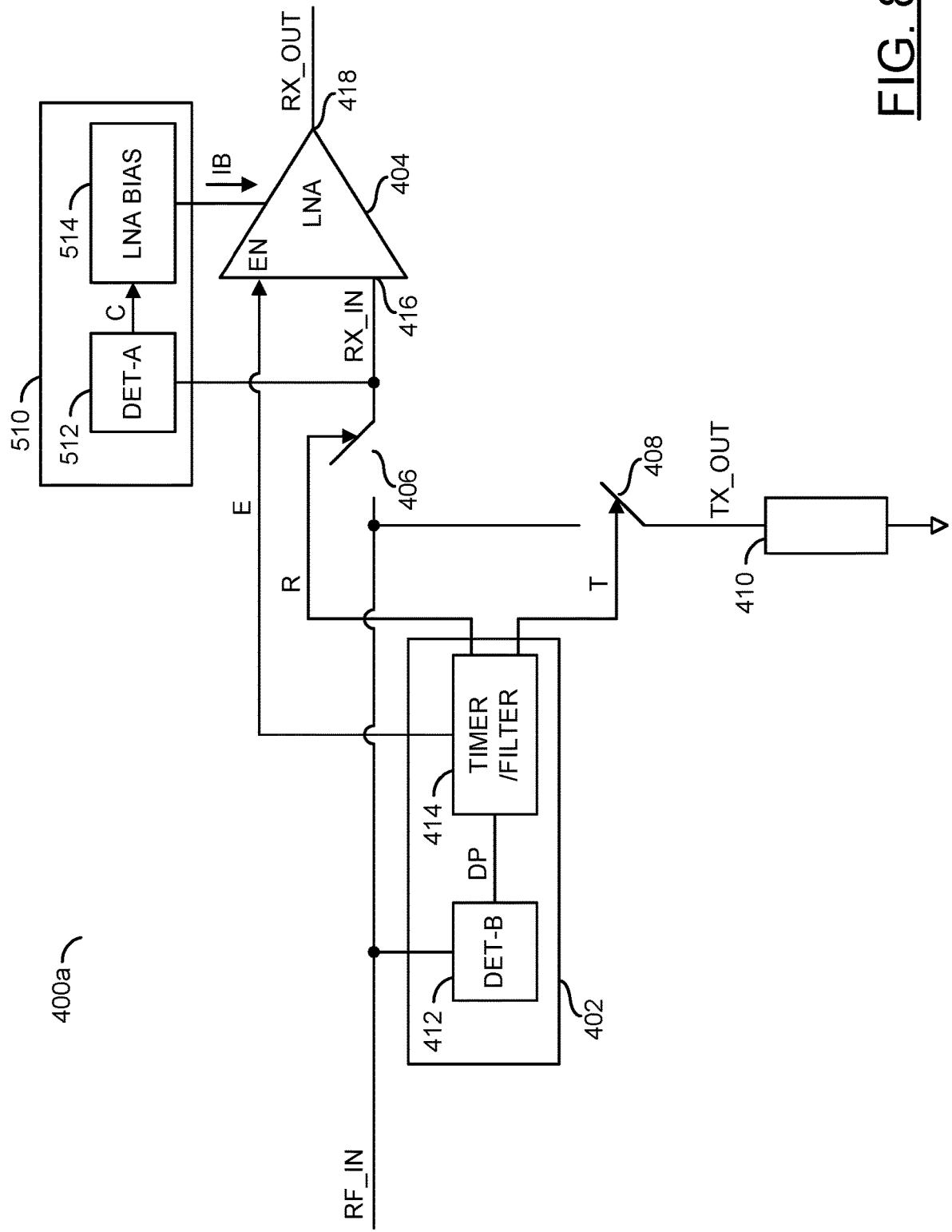
FIG. 8 is a diagram illustrating an apparatus with the routing protection and current limiting protection in accordance with an example embodiment of the invention.

Referring to FIG. 8, a diagram illustrating an example implementation of an apparatus 400a with the routing protection and current limiting protection is shown in accordance with an example embodiment of the invention. The apparatus (or system) 400a may be a variation of the apparatus 400. The apparatus 400a generally comprises the protection circuit 402, the amplifier circuit 404, the receive switch 406, the transmit switch 408, the load circuit 410 and a block (or circuit) 510. The circuit 510 generally comprises a block (or circuit) 512 and a block (or circuit) 514. The circuits 402-514 may be implemented with hardware and/or simulated with software. In various embodiments, the circuits 402-514 may be implemented as one or more integrated circuits.

The signal RX_IN may be received by the circuit 512. A signal (e.g., C) may be generated by the circuit 512 and presented to the circuit 514. The signal C may carry control information used by the circuit 514 to control a bias current to the amplifier 404. The circuit 514 may generate a signal (e.g., IB) received by the amplifier 404. The signal IB may convey the bias current used by the amplifier 404.

The circuit 510 may implement another protection circuit. The protection circuit 510 may be more sensitive to the envelope power/voltage levels in the signal RX_IN than the protection circuit 402 is to the signal RF_IN. The protection circuit 510 may also be located after the receive switch 406 to avoid exposure to high power/voltage levels in the signal RF_IN while the system is in the transmit mode. The protection circuit 402 generally has higher threshold levels than the protection circuit 510. The protection circuit 402 may monitor the signal RF_IN continuously (e.g., in both the transmit mode and the receive mode) and so is connected before the receive switch 406.

The circuit 512 may implement a detection circuit. The detection circuit 512 is generally operational to generate the signal C by detecting the amount of power and/or voltage present in the signal RX_IN relative to an initial power/voltage thresholds. While the envelope power/voltage levels in the signal RX_IN are below the initial power/voltage thresholds, the detection circuit 512 may generate the signal C in a non-limiting state. While at least one of the envelope power/voltage levels in the signal RX_IN is above the initial power/voltage thresholds, the detection circuit 512 may generate the signal C in a variable limiting state. The variable limiting state may increase as the envelope power/voltage levels in the signal RX_IN increase. The initial power/voltage levels may be lower than the power/voltage thresholds detected by the detection circuit 412. In various embodiments, the initial power threshold may be approximately −13±2 dBm. Other power thresholds and/or voltage thresholds may be implemented to meet the design criteria of a particular application.

The circuit 514 may implement a current limiting circuit responsive to the signal C. While the signal C is in the variable limited state, the current limiting circuit 514 may be operational to limit the bias current IB used by the amplifier circuit 404 based on the value in the signal C. While the signal C is in the non-limited state, the current limiting circuit 514 may be operational to pass the full bias current in the signal IB to the amplifier circuit 404.

A combination of the protection circuit 402 and the protection circuit 510 may provide a two-stage overvoltage/overpower protection mechanism for the amplifier circuit 404. The protection circuit 510 may engage when the input power/voltage in the signal RX_IN (and RF_IN) exceeds the initial power/voltage thresholds. The engaged protection circuit 510 may reduce (or limit) the current in the signal IB to the amplifier circuit 404. The protection circuit 510 generally implements a fast reaction protection with a minimum delay to react to the modulation envelope of the signal RX_IN. The protection circuit 402 may engage when the input power/voltage in the signal RF_IN exceeds the higher power/voltage thresholds for a minimum time. If the input power/voltage exceeds the corresponding power/voltage thresholds and the timing criteria are meet, the protection circuit 402 may open the receive switch 406, close the transmit switch 408 and disable the amplifier 404.

Figure 9:
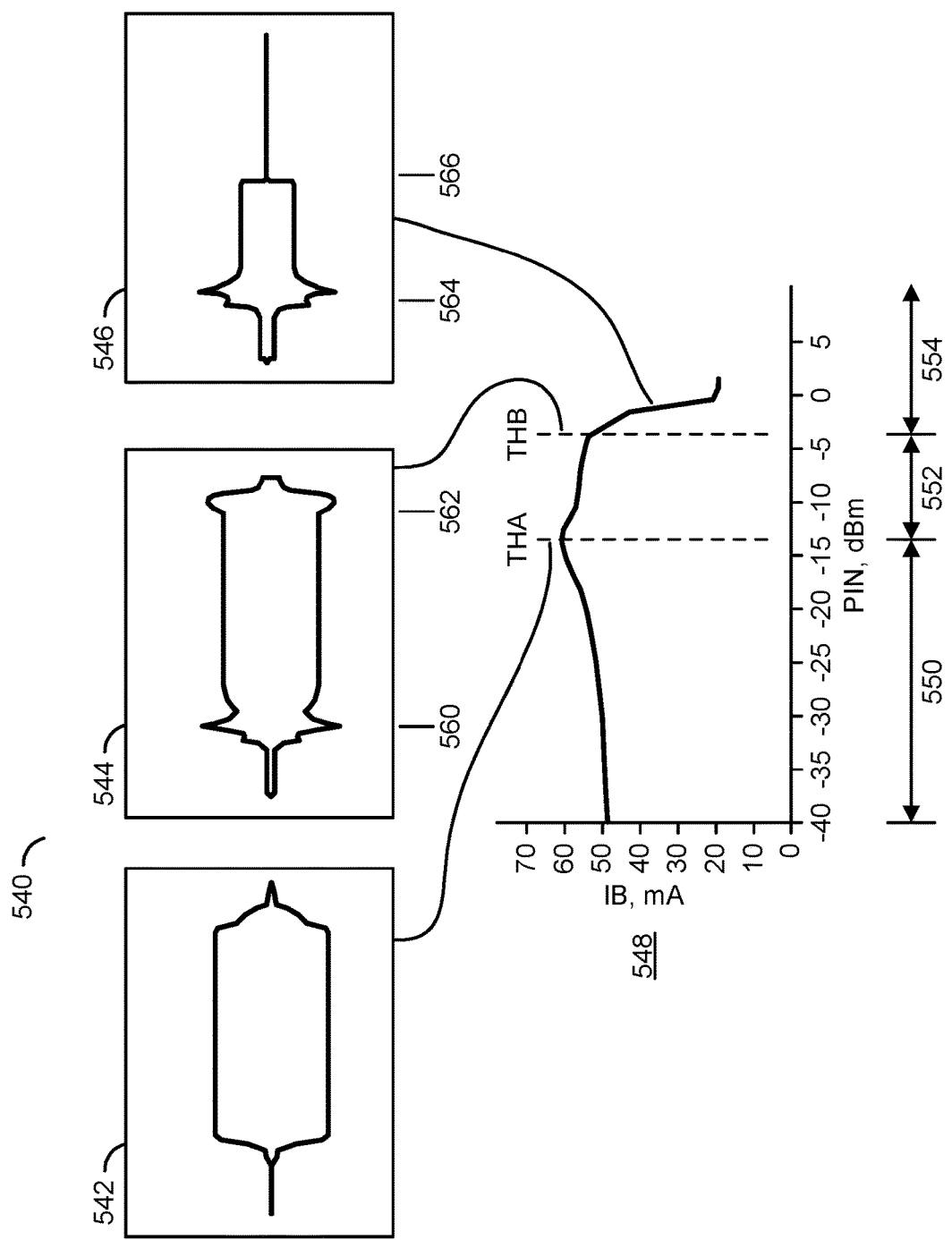
FIG. 9 is a diagram illustrating waveforms of the apparatus of FIG. 8 in accordance with an example embodiment of the invention.

Referring to FIG. 9, a diagram 540 illustrating example waveforms of the apparatus 400a is shown in accordance with an example embodiment of the invention. A waveform 542 may represent the signal RX_OUT amplified to −15 dBm while the envelope power/voltage levels of the signal RF_IN are less than the initial power/voltage thresholds (e.g., both illustrated as THA) established in the protection circuit 510. A waveform 544 may represent the signal RX_OUT amplified to −3 dBm while the envelope power/voltage levels of the signal RF_IN exceed the initial threshold THA and is less than the power/voltage thresholds (e.g., both illustrated as THB) established in the protection circuit 402. A waveform 546 may represent the signal RX_OUT amplified to 1 dBm while the envelope power/voltage levels of the signal RF_IN exceeds the power/voltage threshold THB. A waveform 548 may represent the bias current IB consumed by the amplifier circuit 404.

While the input signal RF_IN has an envelope power/voltage level of less than the initial power/voltage threshold THA, the protection circuit 510 may not limit the bias current IB, and the protection circuit 402 may route the input signal RF_IN to the amplifier circuit 404. The signal RX_OUT shown in the waveform 542 may be an amplified version of the input signal RF_IN. As the envelope power/voltage levels in the input signal RF_IN increases, the bias current IB consumed by the amplifier circuit 404 generally increases, see region 550.

When the envelope power/voltage levels of the signal RF_IN exceed the initial power/voltage threshold THA (e.g., at time 560) for at least a minimum engagement time period, the protection circuit 510 may limit the bias current IB to the amplifier circuit 404. An amplitude of the output signal RX_OUT may be reduced as the amplification provided by the amplifier circuit 404 is reduced, as shown in the waveform 544. As the envelope power/voltage levels in the input signal RF_IN further increase, the bias current IB consumed by the amplifier circuit 404 generally decreases as the protection circuit 510 increases the limitation on the bias current IB, see region 552.

When the envelope power/voltage levels of the signal RF_IN both return below the initial threshold THA (e.g., at time 562) for at least the minimum current disengagement time period, the protection circuit 510 may restore the full available bias current to the amplifier circuit 404. An amplitude of the output signal RX_OUT may be restored to normal as the amplification provided by the amplifier circuit 404 is restored by the larger bias current IB. Since the power/voltage levels in the input signal RF_IN are less than the power/voltage threshold THB, the protection circuit 402 may keep the input signal RF_IN routed to the amplifier circuit 404 for the entire waveform 544.

When at least one of the envelope power/voltage levels in the signal RF_IN initially exceeds the initial power/voltage threshold THA (e.g., at time 564), the amplifier circuit 404 may continue to amplify the signal RF_IN, as shown in waveform 546. As the power/voltage levels in the signal RF_IN increase, the protection circuit 510 may increase the limitations on the bias current IB, see period 552. When at least one of the envelope power/voltage levels in the signal RF_IN remains above the power/voltage threshold THB for at least the minimum engagement time period (e.g., at time 566), the protection circuit 402 may route the signal RF_IN away from the amplifier circuit 404. Since the amplifier circuit 404 is no longer amplifying an input signal (e.g., the signal RX_IN is zero), the output signal RX_OUT drops to zero and the bias current IB consumed by the amplifier circuit 404 may reduce to a low value, see region 554. All test parts implementing the two-stage protection that were measured with excessive power in the signal RF_IN survived the stress due to the two power protection mechanisms.

Figure 10:
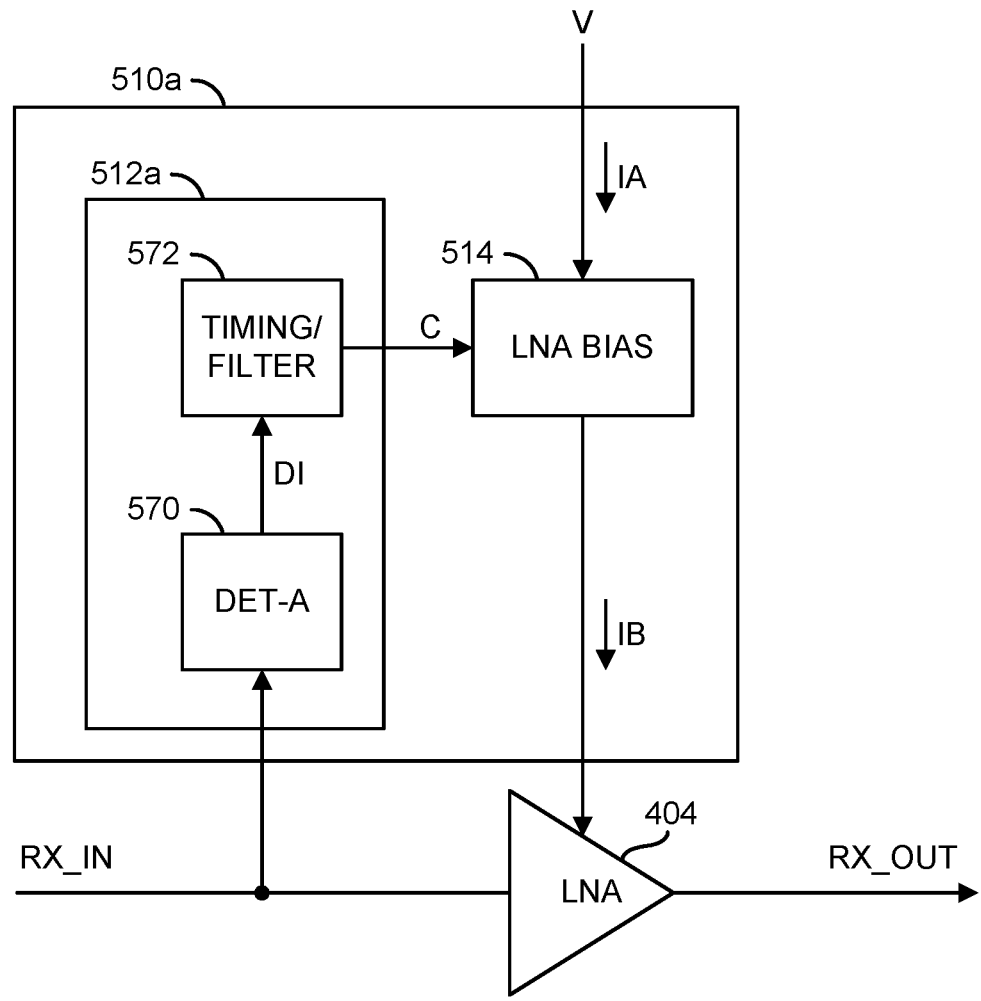
FIG. 10 is a diagram illustrating another apparatus with bias current limiting protection in accordance with an example embodiment of the invention.

Referring to FIG. 10, a diagram illustrating an example implementation of another protection circuit 510a is shown in accordance with an example embodiment of the invention. The circuit 510a may be a variation of the circuit 510. The circuit 510a generally comprises a block (or circuit) 512a and the current limiting circuit 514. The circuit 512a may comprise a block (or circuit) 570 and a block (or circuit) 572. The circuits 512a-572 may be implemented with hardware and/or simulated with software. The circuit 512a-572 may be implemented as one or more integrated circuits.

A signal (e.g., IA) may be transferred from a voltage rail (e.g., V) to the current limiting circuit 514. The signal IA may implement an input bias current available to the amplifier circuit 404. The circuit 570 may generate a signal (e.g., DI) received by the circuit 572. The signal DI may be a detection signal for a power/voltage level in the signal RF_IN. The circuit 572 may generate the signal C received by the current limiting circuit 514. The signal IB may be generated by the current limiting circuit 514 and transferred to the amplifier circuit 404.

The circuit 570 may implement a detection circuit. The detection circuit 570 is generally operational to measure the envelope power/voltage levels in the signal RF_IN. The detection circuit 570 may generate the signal DI in an active (or logical high) state while at least one of the envelope power/voltage levels in the signal RF_IN exceeds a corresponding threshold level. Otherwise, the signal DI may be generated in an inactive (or logical low) state.

The circuit 572 may implement a timer/filter circuit. The timer/filter circuit 572 is generally operational to generate the signal C based on the signal DI relative to an engagement time period and a disengagement time period. If the signal DI is continuously in the active state (e.g., high-power/voltage level) for at least the engagement time period, the timer/filter circuit 572 may generate the signal C in the limiting state. In various embodiments, the engagement time period may be programmable in a range of 2 microseconds to 4 microseconds. If the signal DI is continuously in the inactive state (e.g., low-power/voltage level) for at least the disengagement time period, the timer/filter circuit 572 may generate the signal C in the non-limited state. The disengagement time period may be separately programmable in a range of 2 microseconds to 4 microseconds.

While the signal DI is continuously in the active state for at least the engagement time period, the current limiting circuit 514 may limit the bias current IB received by the amplifier circuit 404. The limited bias current flowing into the amplifier circuit 404 may protect the amplifier circuit 404 from being damaged by excessive power and/or voltage in the signal RX_IN. While the signal DI is continuously in the inactive state for at least the disengagement time period, the current limiting circuit 514 may undo the limiting of the bias current IB. The unrestricted bias current IB may enable the amplifier circuit 404 to perform a normal amplifying function for the signal RX_IN.

Although embodiments of the invention have been described in the context of a fifth-generation (5G) application, the present invention is not limited to 5G applications, but may also be applied in other high data rate wireless and wired communications applications where different rapid switching, multiple channel, and multiple user issues may exist. The present invention addresses concerns related to high speed wireless communications, mobile and stationary transceivers and point-to-point links. Future generations of wireless communications applications using radio frequency (RF), microwave, and millimeter-wave links can be expected to provide increasing speed, increasing flexibility, and increasing numbers of interconnections and layers. The present invention may also be applicable to wireless communications systems implemented in compliance with either existing (legacy, 2G, 3G, 4G) specifications or future specifications.

The functions and structures illustrated in the diagrams of FIGS. 1 to 10 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

Embodiments of the present invention may also be implemented in one or more of ASICs (application specific integrated circuits), FPGAs (field programmable gate arrays), PLDs (programmable logic devices), CPLDs (complex programmable logic device), sea-of-gates, ASSPs (application specific standard products), and integrated circuits. The circuitry may be implemented based on one or more hardware description languages. Embodiments of the present invention may be utilized in connection with flash memory, nonvolatile memory, random access memory, read-only memory, magnetic disks, floppy disks, optical disks such as DVDs and DVD RAM, magneto-optical disks and/or distributed storage systems.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

What is claimed is:

1. A semiconductor device comprising:
   an amplifier circuit configured to generate an output signal by amplifying an input signal received at an input port, the input signal being a radio-frequency signal;
   a protection circuit configured to:
      control a first switch and a second switch, the first switch being configured to pass the input signal to the amplifier circuit, and the second switch being configured to pass the input signal to a transmit channel; and
      monitor a level of the input signal, the input signal being at least one of a power level and a voltage level; and
      generate a detection signal when the level of the input signal exceeds a threshold value,
   wherein when detection is continuously active at a first time duration, the protection circuit is configured to control the first switch to be an open state, and control the second switch to be a closed state.

2. The semiconductor device according to the claim 1, wherein when detection is continuously inactive at a second time duration, the protection circuit is configured to control the first switch to be the closed state, and control the second switch to be the open state.

3. The semiconductor device according to the claim 2, wherein a time of the first duration and a time of the second time duration are programmable separately.

4. The semiconductor device according to the claim 2, wherein the protection circuit is configured to monitor a level of the input signal at a node connected between the input port and the first switch.

* * * * *